(12) United States Patent
Souchkov

(10) Patent No.: US 9,431,440 B2
(45) Date of Patent: Aug. 30, 2016

(54) OPTICAL SENSOR

(71) Applicant: Maxim Integrated Products, Inc., San Jose, CA (US)

(72) Inventor: Vitali Souchkov, Concord, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/930,144

(22) Filed: Jun. 28, 2013

(65) Prior Publication Data

US 2014/0264702 A1 Sep. 18, 2014

Related U.S. Application Data

(60) Provisional application No. 61/781,409, filed on Mar. 14, 2013.

(51) Int. Cl.
*H01L 27/144* (2006.01)
*H01L 27/146* (2006.01)

(52) U.S. Cl.
CPC ..... *H01L 27/1446* (2013.01); *H01L 27/14643* (2013.01); *H01L 27/14645* (2013.01)

(58) Field of Classification Search
None
See application file for complete search history.

(56) References Cited

U.S. PATENT DOCUMENTS

| 3,700,895 | A  | * | 10/1972 | Dicke | 378/2 |
|---|---|---|---|---|---|
| 3,776,638 | A  | * | 12/1973 | Teter | 356/124 |
| 6,327,073 | B1 | * | 12/2001 | Yahav et al. | 359/321 |
| 2010/0163933 | A1 | * | 7/2010 | Xu et al. | 257/230 |
| 2010/0203859 | A1 | * | 8/2010 | Yoshikawa | H01P 1/20345 455/296 |
| 2011/0079869 | A1 | * | 4/2011 | Mazzillo | 257/443 |
| 2012/0280107 | A1 | * | 11/2012 | Skurnik | G06F 3/0416 250/206.1 |
| 2015/0301153 | A1 | * | 10/2015 | Foxlin | G01S 3/7835 367/128 |

OTHER PUBLICATIONS

Lord Rayleigh; On Pin-Hole Photography; Feb. 1891; The London, Edinburg and Dublin Philosophical Magazine and Journal of Science; Ser. 5, vol. 31; pp. 1-15.
Boyd Fowler; Single Photon CMOS Imaging Through Noise Minimization; Springer Series in Optical Sciences; 2011; Chapter 8; pp. 1-37.

* cited by examiner

*Primary Examiner* — Johannes P Mondt
(74) *Attorney, Agent, or Firm* — Advent, LLP

(57) ABSTRACT

An integrated circuit device includes an active semiconductor substrate comprising an array of photodiodes. The integrated circuit device also includes a dielectric layer disposed adjacent to the active semiconductor substrate proximate to the array of photodiodes. The dielectric layer has a first side adjacent to the active semiconductor substrate and a second side opposite from the active semiconductor substrate. The dielectric layer includes a layer of at least substantially opaque material. The layer of at least substantially opaque material defines an aperture configured to permit electromagnetic radiation incident upon the second side of the dielectric layer to reach the array of photodiodes.

20 Claims, 7 Drawing Sheets

OPTICAL SENSOR

CROSS-REFERENCE TO RELATED APPLICATIONS

The present application claims the benefit under 35 U.S.C. §119(e) of U.S. Provisional Application Ser. No. 61/781,409, filed Mar. 14, 2013, and titled "INTEGRATED OPTICAL SENSOR," which is herein incorporated by reference in its entirety.

BACKGROUND

A gesture detection device is a human machine interface (HMI) that allows an operator of an electronic device to provide input to the device using a gesture, such as the bodily motion of hand, a finger, and so forth. For example, an operator may use his or her finger to manipulate images on an electronic display, such as a display attached to a mobile computing device, a personal computer (PC), or a terminal connected to a network. In some cases, the operator may use two or more fingers simultaneously to provide unique commands, such as a zoom command executed by moving two fingers away from one another, a shrink command executed by moving two fingers toward one another, and so forth. An electronic visual display can incorporate a gesture detection device to detect the presence and/or location of a gesture. Gesture detection devices can be used with devices such as all-in-one computers, tablet computers, satellite navigation devices, gaming devices, and smartphones. A gesture detection device enables an operator to interact directly with information that is displayed by a display rather than indirectly with a pointer controlled by a mouse or touchpad.

SUMMARY

An integrated circuit device includes an active semiconductor substrate comprising an array of photodiodes. The integrated circuit device also includes a dielectric layer disposed adjacent to the active semiconductor substrate proximate to the array of photodiodes. The dielectric layer has a first side adjacent to the active semiconductor substrate and a second side opposite from the active semiconductor substrate. The dielectric layer includes a layer of at least substantially opaque material. The layer of at least substantially opaque material defines an aperture configured to permit electromagnetic radiation incident upon the second side of the dielectric layer to reach the array of photodiodes.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

Figure 1:
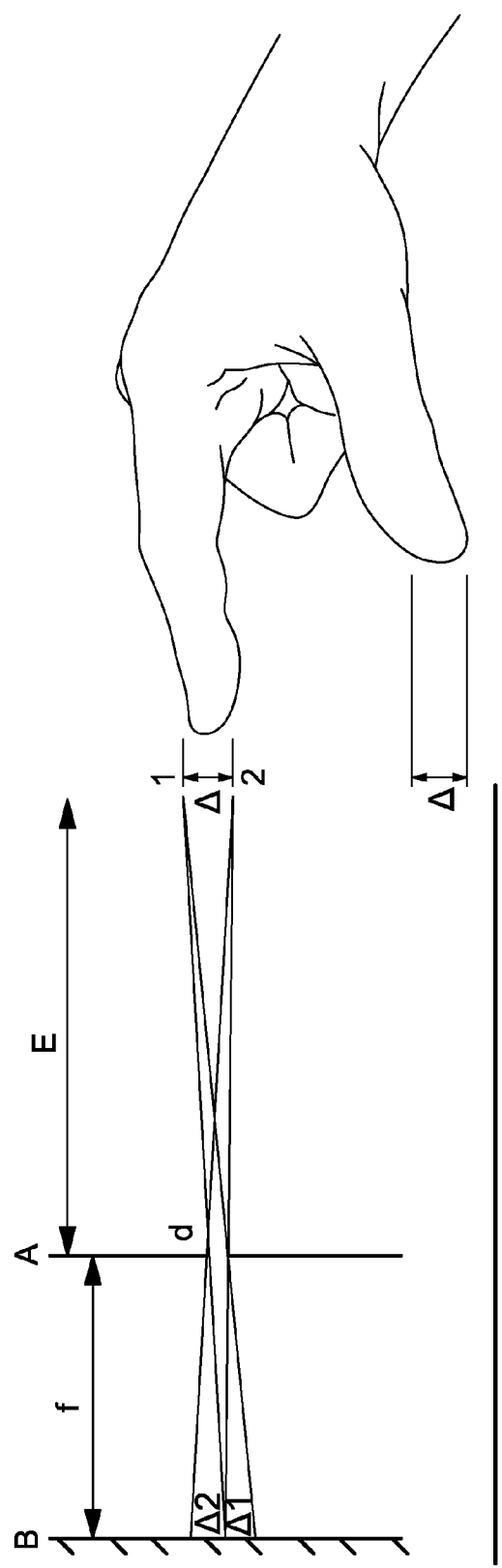
FIG. 1 is a diagrammatic illustration of a pinhole camera in accordance with example embodiments of the present disclosure.

A pinhole camera is a simple camera that uses a single small aperture. Pinhole cameras can be used in various imaging applications, including applications that do not use a lens to provide optical power. Typically, a pinhole is created in opaque material. The pinhole restricts light coming from an object so that a point on the object corresponds to a small spot on the resulting image. When the pinhole size is small relative to the distance to the object, the overlap between image spots that correspond to different points on an object is small, creating a one-to-one correspondence between object points and image spots. Wave properties of light generally impose a lower limit on pinhole size, so that the pinhole has an opening larger than the wavelength of the radiation used (diffraction limit). The projection of radiation from the pinhole to an image plane with a size approximately the same as the pinhole itself typically provides the resolution limit of the pinhole camera.

As described herein, an integrated optical sensor comprises a camera and pixel array implemented in a complementary metal-oxide-semiconductor (CMOS) technology environment. The example integrated optical sensors do not necessarily require external (e.g., semiconductor package) components and can be fabricated in a small integrated circuit (e.g., as a "smart dust" sensor). In embodiments of the disclosure, integrated optical sensors are implemented as optical finger tracking and/or gesture recognition devices for display, control, compute, and/or touch devices. In some embodiments, technological metal is used as an opaque material to form an elementary pinhole. Disposed adjacent the elementary pinhole is an imaging sensor array formed on active silicon (e.g., an array of charge acquisition devices such as photodiodes having a size on the order of, for instance, several tens of pixels). As described herein, each photodiode has a sensor area at least substantially equal to the pinhole area. The focal length above the elementary pinhole camera can be determined by the thickness of, for example, the technological dielectric stack.

In embodiments of the disclosure, tracking is provided using an integrated optical sensor between approximately one centimeter (1 cm) and approximately ten centimeters (10 cm) from the sensor array. Further, tracking is provided for multiple objects, such as multiple fingers. For example, in some embodiments, five objects are tracked simultaneously. In this manner, an integrated optical sensor can be used to detect complex gestures, such as a zoom command executed by moving two fingers away from one another, a shrink command executed by moving two fingers toward one another, and so forth.

In some embodiments, an array of cameras is used to increase signal strength and signal to noise ratio (e.g., for a back-end signal processor to derive finger tracking and gesture recognition information from detected imaging signals). For example, signal enhancement is achieved by connecting corresponding photodiodes of elementary camera arrays in parallel, where each array supplies identical, or at least substantially identical, image information. When an integrated optical sensor as described herein is implemented with a device that uses an external source of electromagnetic radiation to illuminate an object, such as an infrared (IR) light emitting diode (LED) device, the intensity of the electromagnetic radiation source can be reduced, improving power consumption characteristics of the device.

Techniques and devices as described herein are used for applications including, but not necessarily limited to: finger tracking, gesture recognition, optical detectors for optical sensing, gesture and touch screen applications, display control applications, and so forth. For example, the techniques and devices described can be used to interface with electronic devices, including but not necessarily limited to: large touch panel products, touchpad products, all-in-one computers, mobile computing devices (e.g., hand-held portable computers, Personal Digital Assistants (PDAs), laptop computers, netbook computers, tablet computers, and so forth), mobile telephone devices (e.g., cellular telephones and smartphones), devices that include functionalities associated with smartphones and tablet computers (e.g., phablets), portable game devices, portable media players, multimedia devices, satellite navigation devices (e.g., Global Positioning System (GPS) navigation devices), e-book reader devices (eReaders), Smart Television (TV) devices, surface computing devices (e.g., table top computers), Personal Computer (PC) devices, as well as with other devices that employ gesture-based human interfaces in consumer and/or industrial electronic devices.

Example Implementations

Referring to FIG. 1 finger tips of size Δ are observed on image plane B through a pinhole of diameter d created in an opaque material at plane A. In some embodiments, the finger tips are illuminated by a source of electromagnetic radiation having a certain characteristic (e.g., wavelength), with the electromagnetic radiation source positioned proximal to the detector plane (e.g., aside plane B). In some embodiments, a low intensity LED is positioned proximate to the pinhole camera and pixel array to illuminate a portion of an operator's body, such as a hand or a finger. The low intensity LED can be configured to generate electromagnetic radiation having one or more characteristic wavelengths in the visible and/or infrared spectrum (e.g., ranging from at least approximately three hundred nanometers (300 nm) to at least approximately one thousand one hundred nanometers (1,100 nm)). In other embodiments, illumination is provided with radiation from an external environment (e.g., natural light, indoor light from a light fixture of a room, and so forth). As shown, at a certain distance of the finger tips from plane A, images of the finger tips are resolved at image plane B (e.g., at locations corresponding to points 1 and 2 at the edges of the finger tip).

Figure 2:
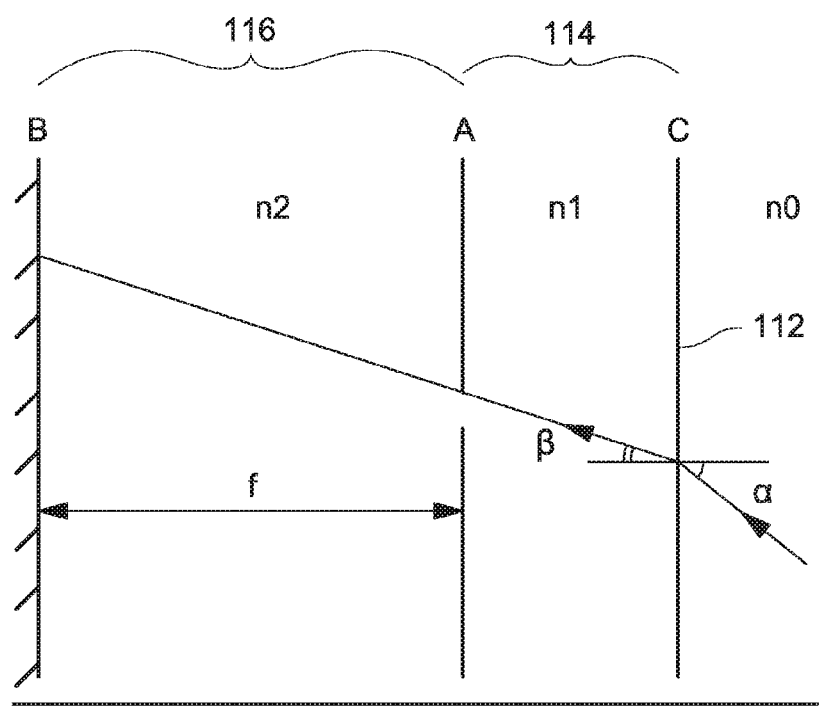
FIG. 2 is a diagrammatic illustration of an integrated technology environment for a pinhole camera in accordance with example embodiments of the present disclosure.

Referring now to FIG. 2, an integrated technology environment for one or more front illuminated light sensors is described in relation to a pinhole camera (e.g., as described with reference to FIG. 1), where B is a detector plane formed on active silicon, A is a plane of opaque material (e.g., technological metal, polysilicon dielectric material on metal, and so forth), and C is a front-end dielectric surface 112 (e.g., epoxy and so on). In this example, the dielectric media have refraction indexes n0, n1, and n2, where n0 is the refraction index for the external environment (e.g., air), n1 is the refraction index for the dielectric medium 114 between the external environment and the plane of opaque material A, and n2 is the refraction index for the dielectric medium 116 between the plane of opaque material A and the detector plane B. In the present example, it is assumed without limitation to sensor operation that n0 is equal to at least approximately one (1) and n1 and n2 are both equal to at least approximately one and one-half (1.5). Due to the refraction index of the technology dielectric being larger than the refraction index of the external environment (e.g., air), the divergence of the incident radiation narrows so that the largest angle of incidence to the pinhole is estimated from Snell's law as follows: $\sin(\beta) \leq 1/n$. In the present example, the field of view a for the pinhole thus narrows to approximately plus-or-minus forty-two degrees)(±42°) or less.

Figure 3:
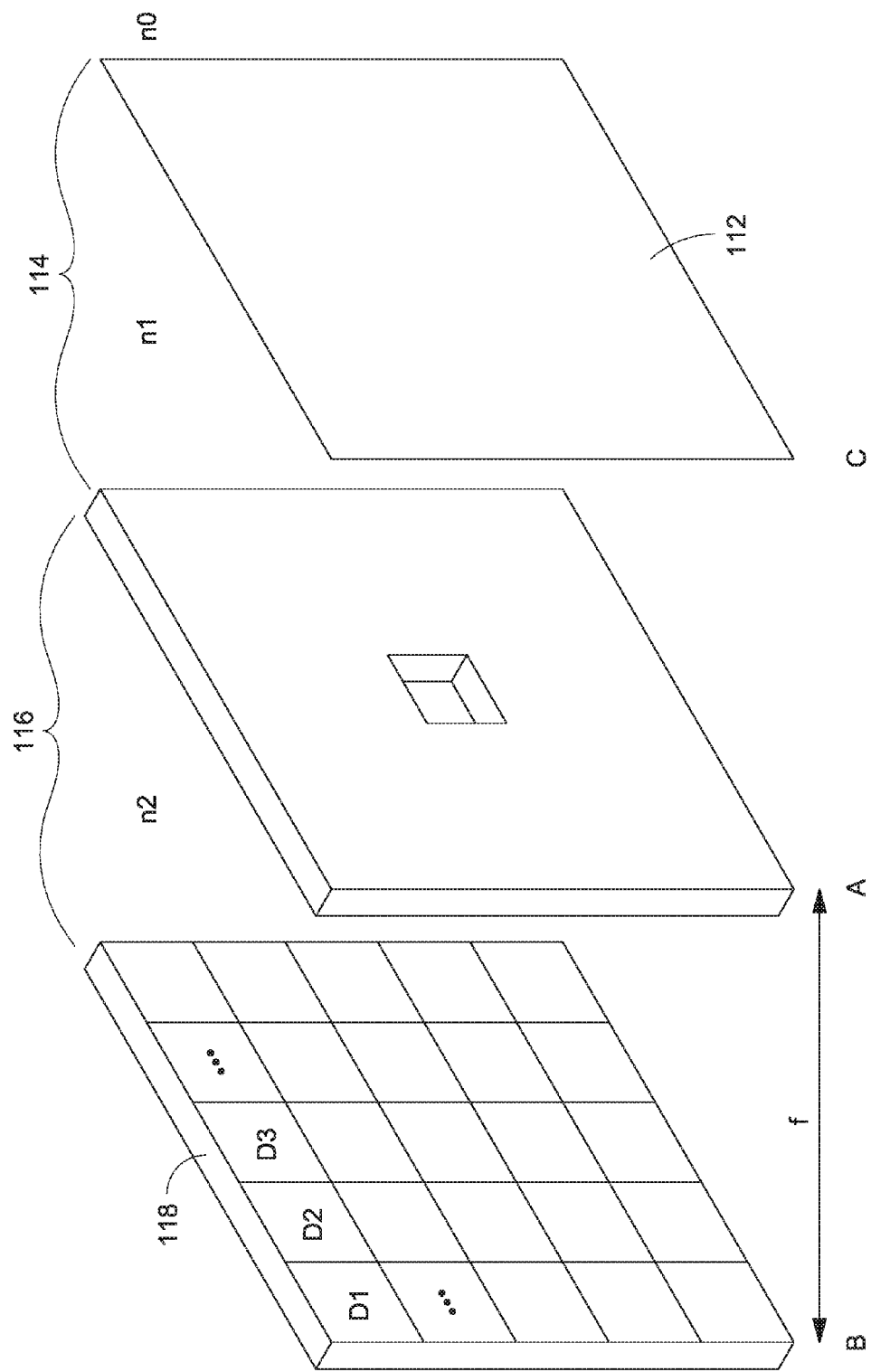
FIG. 3 is a diagrammatic illustration of a pinhole camera formed using integrated technology in accordance with example embodiments of the present disclosure.

Though integrated technologies allow a sub-micrometer size pinhole design, in the present example diffraction may impose a lower limit to the pinhole diameter d as follows:

$$d = 2\sqrt{2f\lambda}$$

where f is the focal length of the pinhole camera (e.g., the distance between the top metal of a dielectric stack and the detector plane), and λ is the wavelength of the radiation used (in the present example, the front-end dielectric refractive index n is used to short λ in the air to λ/n). In an example integrated technology configuration, the near infrared radiation wavelength λ is equal to at least approximately eight hundred and fifty nanometers (850 nm) in the air, and the thickness of the technology (e.g., metal) dielectric stack f is equal to at least approximately eight micrometers (8 μm). From the above expression (e.g., corrected to the front-end dielectric refractive index), a pinhole diameter of at least approximately six micrometers (6 μm) (e.g., five and eight-tenths micrometers (5.8 μm)) is determined. The diameter D of the image created on the active silicon B underneath the pinhole can be estimated from the radiation beam divergence as follows:

$$D = d + 2f \tan(\beta_{max})$$

which for the focal distance f, and with a value for $\beta_{max}$ equal to at least approximately forty-two degrees (42°) gives a value for D equal to at least approximately twenty and four-tenths micrometers (20.4 μm). Depending on requirements for image quality (e.g., which can be relaxed when imaging is used for finger tracking and so forth), an array of approximately four micrometers (4 μm) by four micrometers (4 μm) area photodiodes of five by five (5×5) pixels, or an array of approximately five micrometers (5 μm) by five micrometers (5 μm) area photodiodes of four by four (4×4) pixels is used. In these configurations, the area of the sensor array proximate to the pinhole is approximately twenty-one micrometers (21 μm) by twenty-one micrometers (21 μm). However, it should be noted that these array areas and number of pixels are provided by way of example only and are not meant to limit the present disclosure. Thus, different parameters and/or variations to the configuration of the dielectric stack can allow other array configurations. With reference to FIG. 3, an elementary pinhole camera formed using integrated technology is shown with photodiode locations designated as D1, D2, D3, and so forth.

In some implementations, integrated sensors for gesture sensing applications use at least approximately one hundred microwatt per square-centimeter (100 μW/cm²) signal optical power incident at a photodiode, with a radiation source operating at a wavelength of at least approximately eight hundred and fifty nanometers (850 nm), which corresponds to at least approximately sixteen picowatt (16 pW) power incident at a four micrometers (4 μm) by four micrometers (4 μm) area of elementary pixels of the pinhole camera. The photocurrent of one four micrometers (4 μm) by four micrometers (4 μm) area photodiode can be estimated as follows:

$$I = q_0 \frac{W\lambda}{hc} QE$$

where $q_0$ represent electron charge, W represents optical power, QE represents photodiode quantum efficiency, c represents the speed of light, and h represents Planck's constant (equal to approximately three and twenty-eight one-hundredths picoamperes (3.28 pA) at a QE of approximately thirty percent (30%)). In a configuration with approximately ten microsecond (10 μs) electronic shutter time (e.g., image exposure acquisition time), the charge integrated over the exposure time is equal to approximately two hundred (200) electrons for four micrometers (4 μm) by four micrometers (4 μm) active area of a photodiode, which provides an adequate signal to noise ratio with CMOS imaging technologies (e.g., more than at least approximately ten (10) for above signal power). In some embodiments, finger tracking may require operation at lower light source emission power without using a dedicated imaging technology. Thus, an array of cameras covering an area available for the photodiodes is provided for signal to noise ratio enhancement. Photodiodes at similar positions in elementary arrays can be connected in parallel, and the sum of the image signals of the elementary sensors is provided to a processor (e.g., for finger tracking, gesture recognition, and so forth).

Figure 4:
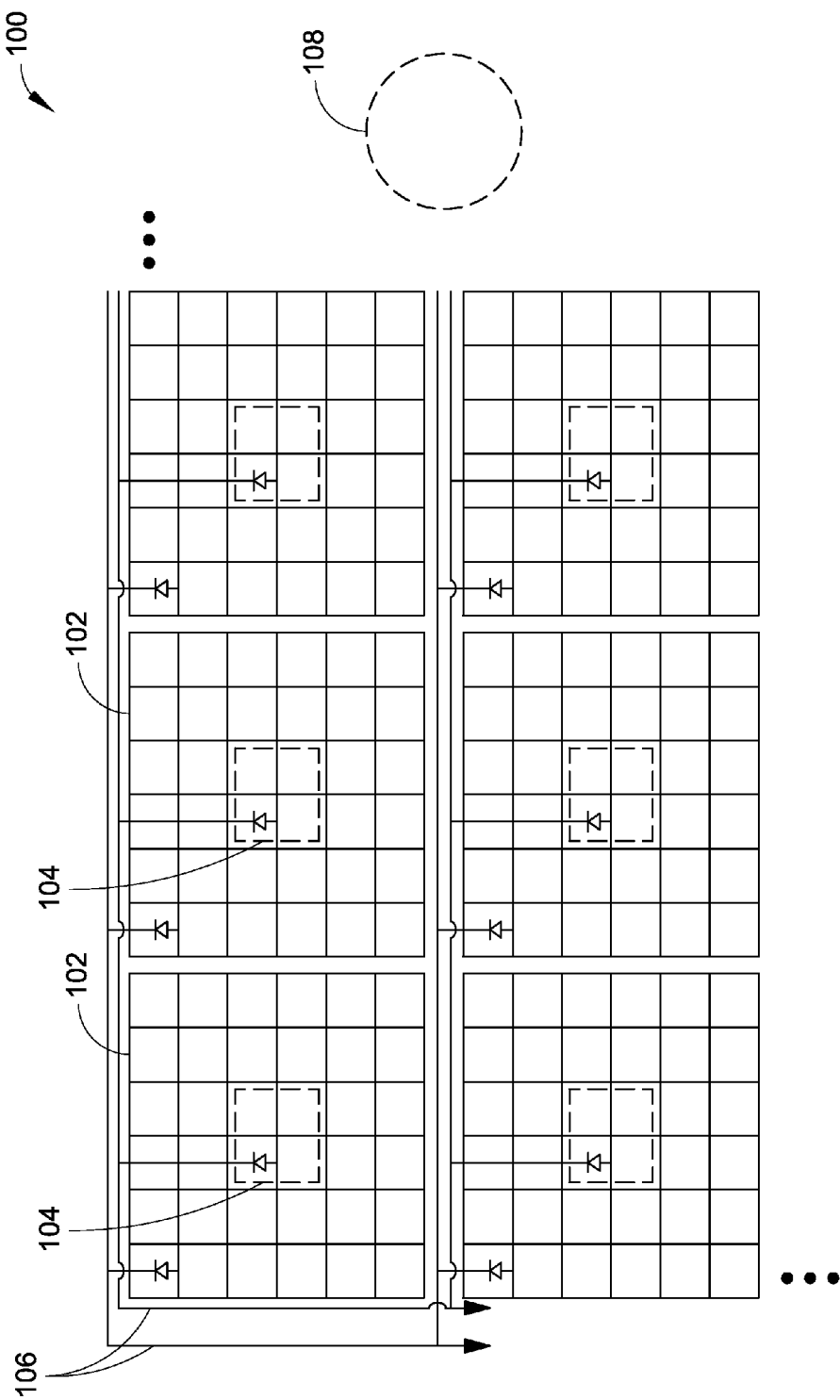
FIG. 4 is a diagrammatic illustration of multiple pinhole cameras formed using integrated technology, where corresponding photodiodes of different cameras are connected in parallel in accordance with example embodiments of the present disclosure.

Referring now to FIG. 4, connection photodiodes of elementary pinhole cameras are described. As shown in FIG. 4, an integrated optical sensor 100 includes multiple arrays of photodiodes 102 disposed beneath pinholes 104 formed in a layer of at least substantially opaque material. Each photodiode is electrically connected to readout circuitry using an electrical connection 106. In this example, thermal noise and photodiode leakage current is approximately five and one-half femtoamperes per square micrometer (5.5 fA/μm²) at seventy-five degrees Celsius (75° C.) for example near infrared photodiodes, and the contribution to the noise charge is estimated as follows:

$$Q_n = \frac{1}{q_0} \sqrt{\frac{4kTC_d}{2\pi\tau \frac{g_m}{C_i}} \left(\sqrt{m} + \frac{1}{\sqrt{m}}\right)^2 + \frac{I_{lea}\tau}{\pi}}$$

where m is equal to $C_i/C_d$ and represents a ratio of an input transistor to photodiode capacitance, $g_m/C_i$ is equal to $f_T$ and represents unity gain bandwidth for the input metal-oxide-semiconductor (MOS) transistor of the technology, and τ represents electronic shutter and/or photocurrent integration time. In this example, noise charge is proportional to the square root of photodiode active area, while the signal is proportional to the area itself. Thus, using, for instance, a ten by ten (10×10) array for elementary pinhole cameras of twenty micrometers (20 μm) by twenty micrometers (20 μm) areas, each on active silicon, the signal to noise ratio is improved by the square root of active photodiode area ratios, e.g., ten times (10×) compared to a single elementary pinhole camera array. It should be noted that a ten by ten (10×10) array is provided by way of example only and is not meant to be restrictive of the present disclosure. In other configurations, different numbers and areas are provided for the photodiodes. For example, in some embodiments, an array of fifty by fifty (50×50) pinholes is provided.

Figure 5:
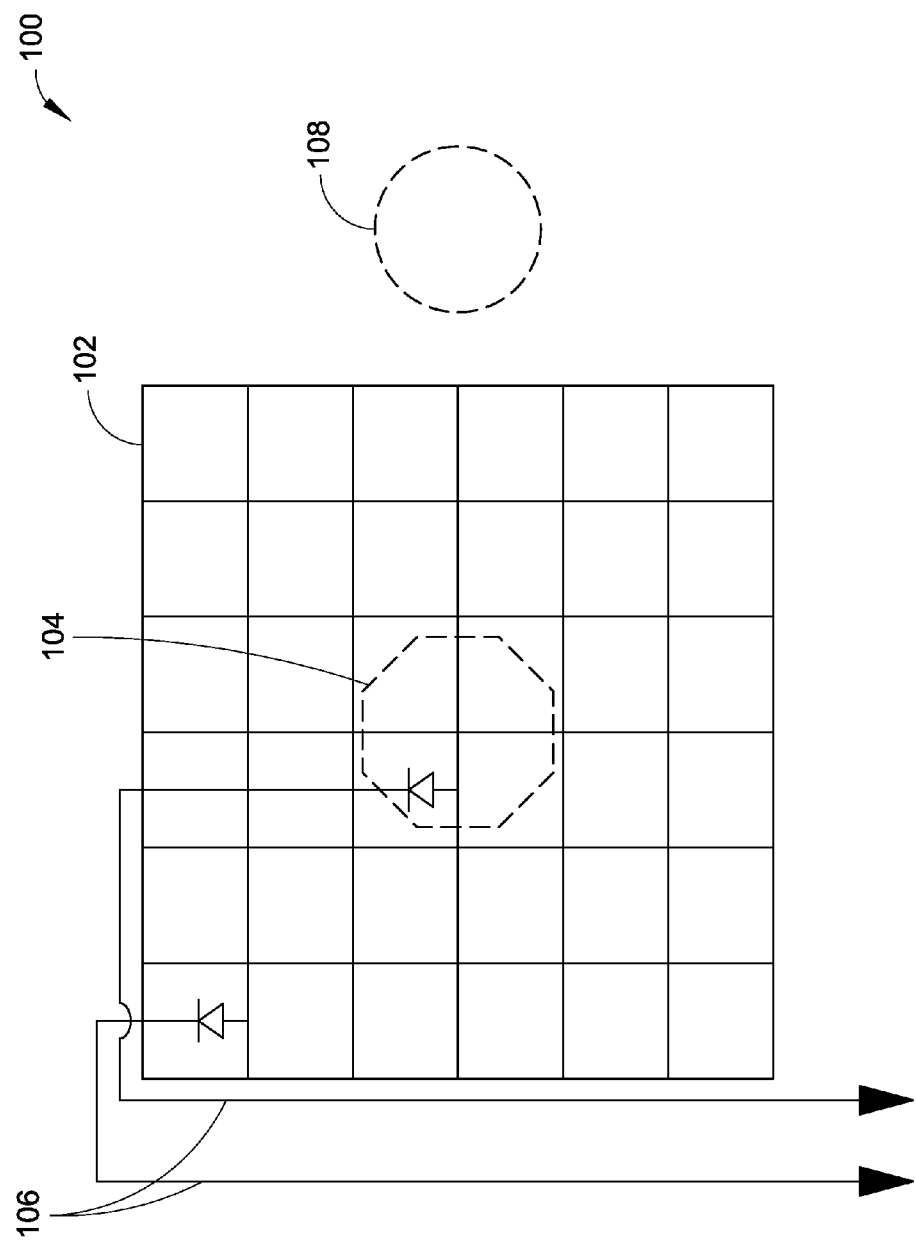
FIG. 5 is a top plan view illustrating a pinhole camera formed using integrated technology in accordance with example embodiments of the present disclosure.
Figure 6:
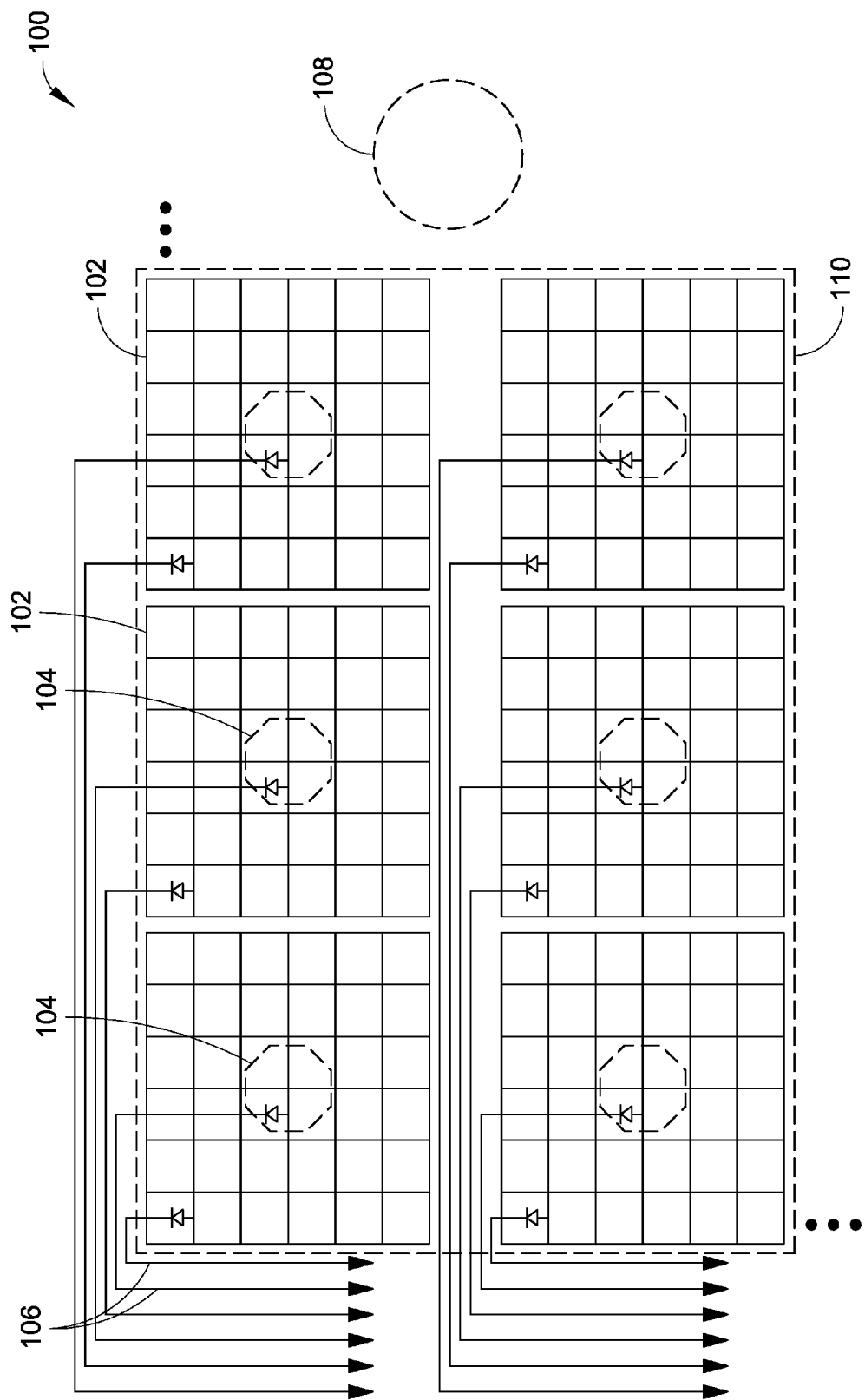
FIG. 6 is a top plan view illustrating multiple pinhole cameras formed using integrated technology in accordance with example embodiments of the present disclosure.

As shown in FIGS. 5 and 6, in some embodiments the pinhole 104 proximate to the sensor array 102 is octagonal-shaped. However, this configuration is provided by way of example only and is not meant to limit the present disclosure. Thus, in other embodiments the pinhole can have other shapes, including but not necessarily limited to: circle shapes and shapes having three or more sides, such as three-sided shapes (e.g., triangle shapes), four-sided shapes (e.g., quadrilateral shapes, rectangle shapes, square shapes, and so forth), five-sided shapes (e.g., pentagon shapes), shapes with more than five sides, and so on.

In some embodiments, a pinhole 104 can be configured to reduce reflections from the material forming the pinhole (e.g., the pinhole walls). For example, one or more walls of a pinhole can be shaped to remove energy from photons incident on the walls to prevent or minimize the photons from being received by the sensor array. Further, one or more of the walls can be coated and/or constructed using material configured to prevent or minimize photons from being received by the sensor array. For instance, one or more walls of a pinhole can be coated and/or formed with opaque material that does not transmit light (visible light, infrared light) (e.g., a dark mirror material), and so forth.

An integrated optical sensor 100 can include a radiation source 108 proximate to the camera and sensor array. In embodiments of the disclosure, the radiation source 108 comprises a source of low intensity electromagnetic radiation having a wavelength between at least approximately three hundred nanometers (300 nm) and at least approximately one thousand one hundred nanometers (1,100 nm), such as an IR LED. In some embodiments, the radiation source is fabricated on the same integrated circuit device as the sensor array 102. In other embodiments, the radiation source is fabricated on a separate integrated circuit device. In these configurations, the radiation source can be packaged with the sensor array 102, mounted proximate to the sensor array 102, and so forth. Further, the radiation source can be modulated. For example, a signal can be acquired by the sensor array 102 with an LED source 108 operating, another signal can be acquired by the sensor array 102 without operating the LED source 108, and a subtraction operation can be performed on the two signals.

In some embodiments, an integrated optical sensor 100 can include a filter 110 configured to correspond to the photoresponsivity of one or more photodiodes (e.g., to avoid saturation of the sensor array by stray light). In embodiments of the disclosure, the filter 110 can be implemented as a blocking filter (e.g., an infrared blocking filter configured to reduce transmission of infrared light while passing visible light), a color pass filter (e.g., a color filter configured to filter visible light in a limited spectrum of wavelengths by blocking (e.g., absorbing or reflecting) visible light within one spectrum of wavelengths while allowing visible light in another spectrum of wavelengths to pass through the filter), an interference filter (e.g., an infrared cut interference filter configured to filter infrared light or a filter that allows visible light to pass in a specified range of wavelengths). In embodiments, a color pass filter may be formed using various deposition techniques, such as spin coating and/or photo patterning (e.g., for absorption filter formation). Likewise, suitable sputtering and plating techniques may be utilized for color interference filter formation. Further, a buffer layer may be formed over the surface of the integrated optical sensor 100 to encapsulate and provide protection to a color pass filter. A buffer layer may be comprised of a polymer material such as Benzocyclobutene (BCB) polymer, or the like. However, it is contemplated that other buffer material may be used.

Example Process

Figure 7:
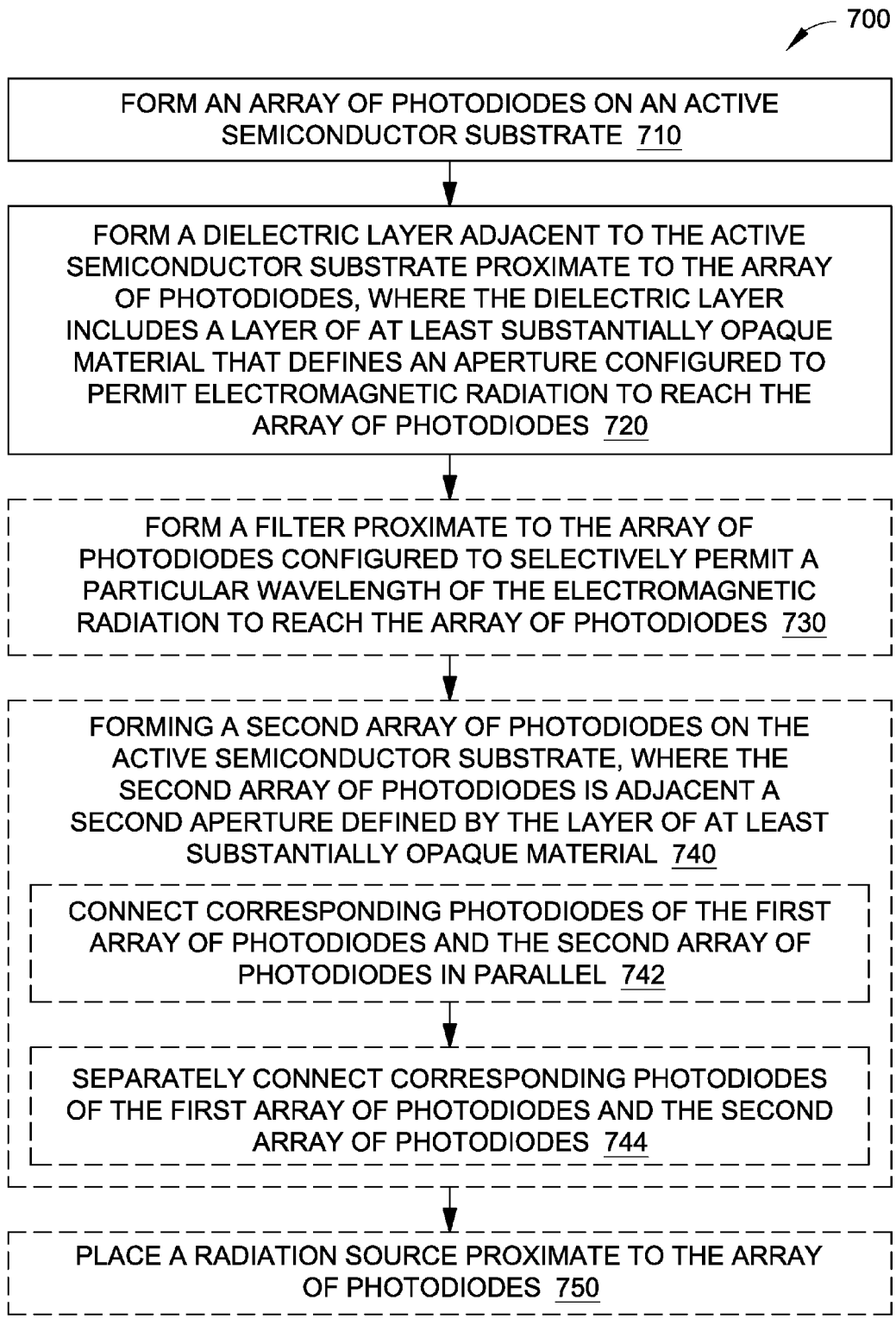
FIG. 7 is a flow diagram illustrating a method of fabricating an integrated optical sensor in accordance with example embodiments of the present disclosure.

Referring now to FIG. 7, example techniques are described for fabricating an integrated optical sensor. FIG. 7 depicts a process 700, in example implementations, for fabricating an integrated optical sensor, such as the integrated optical sensor 100 illustrated in FIGS. 1 through 6 and described above.

In the process 700 illustrated, an array of photodiodes is formed on an active semiconductor substrate (Block 710). For example, with reference to FIGS. 1 through 6, sensor array 102 is formed on an active semiconductor substrate 118. Then, a dielectric layer is formed adjacent to the active semiconductor substrate proximate to the array of photodiodes. The dielectric layer includes a layer of at least substantially opaque material that defines an aperture configured to permit electromagnetic radiation to reach the array of photodiodes (Block 720). For instance, with continuing reference to FIGS. 1 through 6, a layer of dielectric material proximate to the sensor array 102 includes a layer of opaque material, such as technological metal, polysilicon dielectric material on metal, and so forth. The opaque material includes a pinhole 104 configured to permit electromagnetic radiation to reach the sensor array 102.

In some embodiments, a filter is formed proximate to the array of photodiodes. The filter is configured to selectively permit a particular wavelength of the electromagnetic radiation to reach the array of photodiodes (730). For example, with continuing reference to FIGS. 1 through 6, filter 110 is formed proximate to a sensor array 102. In embodiments of the disclosure, filter 110 is configured to correspond to the photoresponsivity of one or more photodiodes of the sensor array 102. In some embodiments, a second array of photodiodes is formed on the active semiconductor substrate. The second array of photodiodes is formed adjacent a second aperture defined by the layer of at least substantially opaque material (Block 740). For instance, with continuing reference to FIGS. 1 through 6, two or more sensor arrays 102 are included with an integrated optical sensor 100.

Then, in some embodiments, two or more corresponding photodiodes of the first array of photodiodes and the second array of photodiodes are connected in parallel (Block 742). For example, with reference to FIG. 4, corresponding photodiodes of two or more sensor arrays 102 are connected to readout circuitry in parallel. In other embodiments, two or more corresponding photodiodes of the first array of photodiodes and the second array of photodiodes are separately connected (Block 744). For instance, with reference to FIG. 6, corresponding photodiodes of two or more sensor arrays 102 are separately connected to readout circuitry.

In some embodiments, a radiation source is placed proximate to the array of photodiodes. For example, with continuing reference to FIGS. 1 through 6, radiation source 108 is positioned proximate to one or more sensor arrays 102. In some embodiments, radiation source 108 is fabricated on the same semiconductor substrate as one or more of the sensor arrays 102. In other embodiments, radiation source 108 can be formed separately and packaged with one or more sensor arrays 102. The radiation source 108 can include a source of low intensity electromagnetic radiation (e.g., having a wavelength between at least approximately three hundred nanometers (300 nm) and at least approximately one thousand one hundred nanometers (1,100 nm), such as an IR LED).

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An integrated circuit device forming a pinhole camera, the integrated circuit device comprising:
   an array of photodiodes on an active semiconductor substrate;
   a dielectric layer disposed adjacent to the active semiconductor substrate proximate to the array of photodiodes, the dielectric layer having a first side immediately adjacent to the active semiconductor substrate and a second side opposite from the active semiconductor substrate, the dielectric layer configured to transmit electromagnetic radiation therethrough;
   a front-end epoxy layer disposed on the second side of the dielectric layer, the front-end epoxy layer and the dielectric layer having at least approximately the same index of refraction; and
   a layer of substantially opaque material disposed between the dielectric layer and the front-end epoxy layer, the layer of substantially opaque material defining an aperture that permits electromagnetic radiation incident upon a surface of the front-end epoxy layer to reach the array of photodiodes to form a plurality of image spots on the array of photodiodes, the plurality of image spots having a one-to-one correspondence with a plurality of object spots on an object located within a field of view of the pinhole camera.

2. The integrated circuit device as recited in claim 1, further comprising a filter configured to selectively permit a particular wavelength of the electromagnetic radiation to reach the array of photodiodes.

3. The integrated circuit device as recited in claim 1, wherein the active semiconductor substrate further comprises a second array of photodiodes disposed adjacent to the dielectric layer and proximate to a second aperture defined by the layer of substantially opaque material.

4. The integrated circuit device as recited in claim 3, wherein at least two corresponding photodiodes of the array of photodiodes and the second array of photodiodes are connected in parallel.

5. The integrated circuit device as recited in claim 3, wherein at least two corresponding photodiodes of the array of photodiodes and the second array of photodiodes are separately connected.

6. The integrated circuit device as recited in claim 1, further comprising a radiation source disposed proximate to the array of photodiodes.

7. The integrated circuit device as recited in claim 6, wherein the radiation source comprises a light emitting diode having a characteristic wavelength between at least approximately three hundred nanometers (300 nm) and at least approximately one thousand one hundred nanometers (1,100 nm).

8. A method of forming a pinhole camera, the method comprising:
   forming an array of photodiodes on an active semiconductor substrate;
   forming a dielectric layer adjacent to the active semiconductor substrate proximate to the array of photodiodes, the dielectric layer having a first side immediately adjacent to the active semiconductor substrate and a second side opposite from the active semiconductor substrate, the dielectric layer configured to transmit electromagnetic radiation therethrough;
   forming a front-end epoxy layer on the second side of the dielectric layer, the front-end epoxy layer and the dielectric layer having at least approximately the same index of refraction; and
   forming a layer of substantially opaque material between the dielectric layer and the front-end epoxy layer, the layer of substantially opaque material defining an aperture that permits electromagnetic radiation incident upon a surface of the front-end epoxy opposite the array of photodiodes of the front-end epoxy layer to reach the array of photodiodes to form a plurality of image spots on the array of photodiodes, the plurality of image spots having a one-to-one correspondence with a plurality of object spots on an object located within a field of view of the pinhole camera.

9. The method as recited in claim 8, further comprising forming a filter proximate to the array of photodiodes configured to selectively permit a particular wavelength of the electromagnetic radiation to reach the array of photodiodes.

10. The method as recited in claim 8, further comprising forming a second array of photodiodes on the active semiconductor substrate, the second array of photodiodes disposed adjacent to the dielectric layer and proximate to a second aperture defined by the layer of substantially opaque material.

11. The method as recited in claim 10, wherein at least two corresponding photodiodes of the array of photodiodes and the second array of photodiodes are connected in parallel.

12. The method as recited in claim 10, wherein at least two corresponding photodiodes of the array of photodiodes and the second array of photodiodes are separately connected.

13. The method as recited in claim 8, further comprising placing a radiation source proximate to the array of photodiodes.

14. The method as recited in claim 13, wherein the radiation source comprises a light emitting diode having a characteristic wavelength between at least approximately three hundred nanometers (300 nm) and at least approximately one thousand one hundred nanometers (1,100 nm).

15. An integrated circuit device forming a plurality of pinhole cameras, the integrated circuit device comprising:
   a first array of photodiodes and a second array of photodiodes on an active semiconductor substrate;
   a dielectric layer disposed adjacent to the active semiconductor substrate proximate to the first array of photodiodes and the second array of photodiodes, the dielectric layer having a first side immediately adjacent to the active semiconductor substrate and a second side opposite from the active semiconductor substrate, the dielectric layer configured to transmit electromagnetic radiation therethrough;
   a front-end epoxy layer disposed on the second side of the dielectric layer, the front-end epoxy layer and the dielectric layer having at least approximately the same index of refraction; and
   a layer of substantially opaque material disposed between the dielectric layer and the front-end epoxy layer, the layer of substantially opaque material defining a first aperture that permits electromagnetic radiation incident upon a surface of the front-end epoxy layer opposite the first array of photodiodes to reach the first array of photodiodes to form a first plurality of image spots on the first array of photodiodes, the layer of substantially opaque material defining a second aperture that permits electromagnetic radiation incident upon the second side of the dielectric layer to reach the second array of photodiodes to form a second plurality of image spots on the second array of photodiodes, the first plurality of image spots and the second plurality of image spots each having a one-to-one correspondence with a first plurality of object spots and a second plurality of object spots, respectively, on an object located within a field of view of the plurality of pinhole cameras.

16. The integrated circuit device as recited in claim 15, further comprising a filter configured to selectively permit a particular wavelength of the electromagnetic radiation to reach at least one of the first array of photodiodes or the second array of photodiodes.

17. The integrated circuit device as recited in claim 15, wherein at least two corresponding photodiodes of the first array of photodiodes and the second array of photodiodes are connected in parallel.

18. The integrated circuit device as recited in claim 15, wherein at least two corresponding photodiodes of the first array of photodiodes and the second array of photodiodes are separately connected.

19. The integrated circuit device as recited in claim 15, further comprising a radiation source disposed proximate to at least one of the first array of photodiodes or the second array of photodiodes.

20. The integrated circuit device as recited in claim 15, wherein the integrated circuit device comprises an array of pinhole cameras including the plurality of pinhole cameras, and corresponding photodiodes of each pinhole camera in the array of pinhole cameras are connected in parallel.

* * * * *